United States Patent
Engelmann et al.

(10) Patent No.: US 6,208,242 B1
(45) Date of Patent: Mar. 27, 2001

(54) CIRCUIT CONFIGURATION TO MONITOR A REGULATED OUTPUT VOLTAGE IN A MOTOR VEHICLE

(75) Inventors: Mario Engelmann, Steinbach; Micha Heinz, Darmstadt; Wolfgang Fey, Niedernhausen; Michael Zydeck, Langgöns, all of (DE)

(73) Assignee: Continental Teves AG & Co., OHG, Frankfurt (DE)

( * ) Notice: Subject to any disclaimer, the term of this patent is extended or adjusted under 35 U.S.C. 154(b) by 0 days.

(21) Appl. No.: 09/529,920
(22) PCT Filed: Oct. 22, 1998
(86) PCT No.: PCT/EP98/06726
§ 371 Date: Jun. 23, 2000
§ 102(e) Date: Jun. 23, 2000
(87) PCT Pub. No.: WO99/21745
PCT Pub. Date: May 6, 1999

(30) Foreign Application Priority Data

Oct. 24, 1997 (DE) .............................................. 197 47 014
Nov. 20, 1997 (DE) .............................................. 197 51 429

(51) Int. Cl.[7] .................................................. B60Q 1/00
(52) U.S. Cl. .......................... 340/438; 340/660; 340/661; 340/662; 318/563
(58) Field of Search ..................................... 340/438, 660, 340/661, 662, 663; 318/563; 327/393

(56) References Cited

U.S. PATENT DOCUMENTS

| | | | |
|---|---|---|---|
| 4,428,020 | 1/1984 | Blanchard, Jr. | 361/90 |
| 4,546,437 | 10/1985 | Bleckmann et al. | 364/426 |
| 5,144,248 | 9/1992 | Alexandres et al. | 324/428 |
| 5,648,759 | 7/1997 | Miller et al. | 340/660 |
| 5,805,061 | 9/1998 | Fritz et al. | 340/471 |
| 5,880,568 | 3/1999 | Bederne et al. | 318/563 |
| 5,955,910 | 9/1999 | Levin et al. | 327/393 |

*Primary Examiner*—Daniel J. Wu
*Assistant Examiner*—Phung T Nguyen
(74) *Attorney, Agent, or Firm*—Rader, Fishman & Grauer PLLC

(57) ABSTRACT

The present invention relates to a circuit arrangement to monitor a regulated output voltage in an automotive vehicle, wherein the regulated output voltage is monitored as to whether defined threshold values have been exceeded and/or have fallen short of, wherein the circuit element for regulating the output voltage and the circuit element to monitor whether threshold values have been exceeded or have fallen short of are integrated in one chip, wherein the adjustment of the output voltage is effected by way of a first reference voltage, and wherein monitoring of the threshold values as to whether they have been exceeded or have fallen short of is conducted by way of a second reference voltage.

5 Claims, 1 Drawing Sheet

CIRCUIT CONFIGURATION TO MONITOR A REGULATED OUTPUT VOLTAGE IN A MOTOR VEHICLE

TECHNICAL FIELD

The present invention relates to a circuit arrangement to monitor a regulated output voltage in an automotive vehicle.

BACKGROUND OF THE INVENTION

Electric and electronic components in an automotive vehicle which are operated, or actuated under certain circumstances, by means of an electric voltage may be destroyed when they are acted upon by a too low or too high voltage. In order to compensate for voltage variations in the electrical system of an automotive vehicle, it is known in the art to make available a regulated output voltage and to monitor the level of the output voltage by means of a comparator. With this regulated output voltage, the voltage of the electrical system is adjusted to a defined value by way of a reference voltage.

Where the objective is to integrate the circuit element for generating the regulated output voltage with other circuit elements jointly in one chip, another problem involves the possible destruction of the chip itself due to a wrong output voltage.

This is critical especially in systems which are important for driving safety because, in case of an error, a proper disconnection of the system must be ensured in order to permit activation of a defined emergency operation mode. This applies to ABS/TC (traction slip control) systems, for example.

U.S. Pat. No. 5,648,759 A describes a circuit arrangement for voltage monitoring wherein two reference voltages are used. The first reference voltage is used to regulate the output voltage.

The output voltage is monitored by means of a second reference voltage or a voltage zone between a top limit value and a bottom limit value. Both reference voltages are taken from one single electronic reference voltage source.

Therefore, an object of the present invention is to increase the fail safety of systems of this type.

According to the present invention, this object is achieved by the circuit arrangement of the present invention, wherein the circuit element for regulating the output voltage and the circuit element to monitor whether threshold values have been exceeded or have fallen short of are integrated in one chip, and wherein further the adjustment of the output voltage is effected by way of a first reference voltage, and wherein monitoring of the threshold values as to whether they have been exceeded or have fallen short of is conducted by way of a second reference voltage.

Advantageously, this improves the reliability in detection of an error. It can be detected when any one of the two reference voltages adopts wrong values. In case the first reference voltage is incorrect, there will occur a wrong regulated output voltage, corresponding to the incorrect first reference voltage, which can be detected by means of the second reference voltage. It is then possible to perform error handling when a discrepancy between the regulated output voltage and the second reference voltage is detected. In case the second reference voltage is incorrect, admittedly, the regulated voltage will still adopt the correct values. However, there will nevertheless occur a difference between the regulated output voltage and the second reference voltage, for what reason error handling is carried out also in this case.

This proves favorable compared to a circuit arrangement wherein the regulated output voltage is produced with the same reference voltage which is used to check in a comparator whether the regulated output voltage has adopted the correct value. In case the reference voltage drifts away, the thresholds of the comparator will change in the same sense as the regulated output voltage so that the error will not be noticed. In the present case of application described herein, this may be especially critical for the reasons indicated above. Thus, fail safety will be increased because an error case can be detected before components, in particular components which are critical under safety aspects, will possibly be destroyed.

It is especially advantageous when also the driver stages for the consumers, such as the valve drivers in an ABS/TC system, are jointly integrated in the chip.

In a preferred embodiment of the circuit arrangement, the first reference voltage is used in order to check the regulated output voltage.

This permits detecting, for example, whether the voltage regulation operates incorrectly with a correctly predetermined first reference voltage. This provision permits further improvement of the detection of potential errors and, hence, further enhancement of the fail safety of this system.

Preferably, another electronic circuit is supplied with the output voltage, and this circuit is monitored by means of a watchdog circuit element integrated in the chip of the circuit arrangement, with the oscillator of the watchdog circuit element being supplied with the second reference voltage.

It may be ensured by this embodiment in particular that the further electronic circuit is checked in the circuit arrangement by making use of the second reference voltage. This means if an incorrect voltage is supplied to the further electronic circuit due to an incorrect first reference voltage, this circumstance can be detected in the signals sent by the further electronic circuit to the watchdog circuit. In case no more signals are sent, this will of course be detected by the watchdog circuit as well.

When an error is detected by the watchdog circuit element, driver stages for external consumers will be disconnected in the embodiment of the circuit arrangement according to claim 4.

This proves especially favorable when these driver stages are integrated in the chip. Destruction of the chip is reliably prevented due to this provision. Also, it is possible to switch the system over into an emergency operating mode.

Still, in another embodiment a driver stage to switch on alarm lamps is activated when an error is detected by the watchdog circuit element.

This makes it easy to recognize an error and a consequent disconnection of the system.

Further, checking of the output voltage by means of the first reference voltage is carried out by a comparator which is integrated in the chip of the circuit arrangement, and the microprocessor is reset as soon as the comparator detects that a defined threshold value has been exceeded or has fallen short of.

This renders it possible in a simple fashion to conduct a checking operation with the first reference voltage without increased circuit structure. When this first reference voltage, in the capacity of a comparison voltage with regard to the regulated output voltage, is applied to the input of the comparator, and the output of the comparator is applied to a reset input of the microprocessor, the microprocessor will be reset as soon as the comparator detects an inadmissible difference between the regulated output voltage and the first reference voltage. The microprocessor is then reset by way of the reset input of the microprocessor. Signals are no longer sent to the watchdog circuit element due to this reset of the microprocessor so that a case of error is detected by the watchdog circuit element of the circuit arrangement. This watchdog circuit element (furnished with the second reference voltage) is used to initiate the respective further measures, such as the disconnection of the driver stages of consumers and the activation of a driver for actuating alarm lamps.

This means that detection of an error situation with a deactivation of the system (reset of the microprocessor, deactivation of consumers) can be performed with little circuit structure needed.

In yet another embodiment, the output voltage of the controller is supplied to an input of a comparator whose other input is furnished with the second reference voltage, and it is monitored by means of the comparator whether a defined threshold value of the output voltage has been exceeded or has fallen short of.

The result is that the level of the output voltage is directly compared to the second reference voltage.

Driver stages for external consumers are disconnected when a comparator detects that the defined threshold value has been exceeded or has fallen short of.

This proves particularly favorable when these driver stages are integrated in the chip. Destruction of the chip is reliably prevented by this measure. Besides, the system can be switched over into an emergency operating code.

Preferably, a driver stage for switching on alarm lamps is activated when a comparator detects that the defined threshold value has been exceeded or has fallen short of.

This permits easily recognizing an error and disconnection of the system caused thereby.

DETAILED DESCRIPTION OF THE PREFERRED EMBODIMENTS

Figure 1:
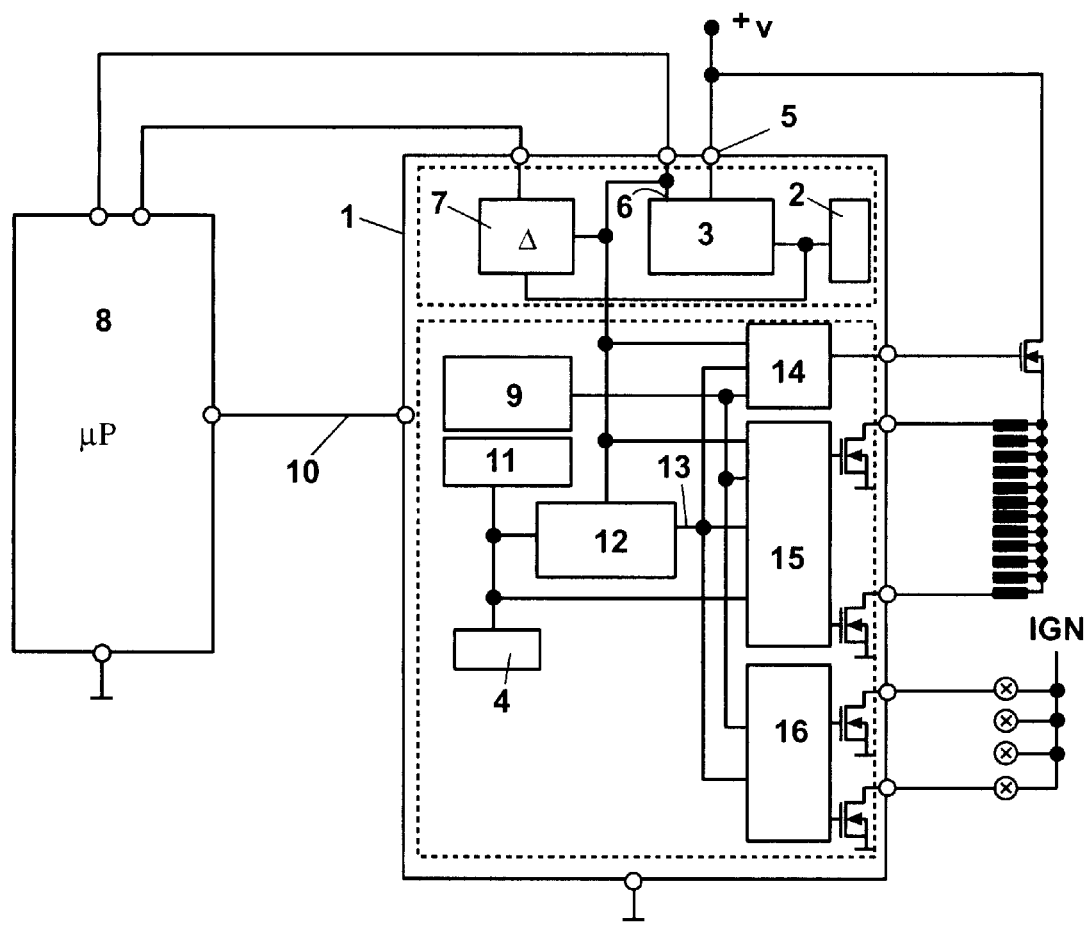
FIG. 1 is a schematic representation of a circuit arrangement 1 for monitoring a regulated output voltage in an automotive vehicle.

Now referring to FIG. 1, circuit arrangement 1 shown is employed in an ABS/TC system. Two reference voltages 2 and 4 which are independent of each other are available in the circuit arrangement. A circuit element 3 of the circuit arrangement 1 comprises a voltage regulator which is supplied with the voltage of the electrical system of the automotive vehicle by way of connection 5 of the circuit arrangement 1 and, further, with the reference voltage corresponding to block 2 in the block diagram of this Figure. At connection 6, the circuit element 3 emits the regulated output voltage which is available internally in the circuit arrangement 1 and for the voltage supply of external appliances.

The first reference voltage corresponding to block 2 and the regulated output voltage of output 6 of the circuit element 3 is sent to a comparator 7. When the comparator 7 detects an excessive difference between its two input voltages, reset of a microprocessor 8 is carried out by way of the output of comparator 7 by sending a corresponding output signal of comparator 7 to an input of microprocessor 8. Microprocessor 8 represents another electronic circuit which is monitored by the circuit arrangement. The circuit arrangement 1 includes a watchdog circuit element 9 for this purpose. Corresponding to the illustration of the connection 10, signals are sent from the microprocessor 8 to the circuit arrangement 1 by which a potential error of the microprocessor 8 shall be detected. Thus, when microprocessor 8 is reset, signals are no longer emitted by way of connection 10 which the watchdog circuit element 9 identifies as an error.

The second reference voltage 4 is applied to oscillator 11 of the watchdog circuit element 9 in order to generate the oscillation frequency of the watchdog circuit element 9. Further, another comparator 12 is supplied with the regulated output voltage by way of output 6 of the circuit element 3 and also with the second reference voltage corresponding to block 4. When the comparator 12 detects an excessive difference between the two input voltages, a corresponding signal is emitted by way of output 13 of comparator 12 which serves to disconnect the main driver 14 and the valve driver outputs 15 of the valves in the brake system of the automotive vehicle equipped with an ABS/TC system. There is further provision of a driver 16 which is activated when this signal appears so that the corresponding alarm lamps are actuated.

Those parts of the circuit arrangement 1 integrated in a chip which are supplied by the circuit element 3, are resistant to overvoltages so that a reliable disconnection of the controller is ensured even if the voltage regulators fail.

Also, the drivers are actuated when an error is detected by the watchdog circuit element 9. As described hereinabove, this can occur when the signals sent by the microprocessor 8 will change or when the second reference voltage changes because these conditions, too, will cause a change in the clock rate of the watchdog circuit element 9 which, in turn, is interpreted as an error.

To ensure a reliable actuation of the alarm lamps in an error case, the alarm lamps are completely independent of the voltage references.

The voltage regulator and voltage monitoring have no interdependencies. This is achieved by the provision of two voltage references in the chip which are completely independent of each other in spatial, mechanical and electrical respects. Advantageously, the second reference voltage can still be used to generate the reference currents for the current limitation of the valves.

Thus, a circuit arrangement of the above type permits integration of the voltage regulator 3, valve driver 15 and charging pump 14 for the actuation of the semiconductor main relay in one chip, with sufficient safety in the error case.

What is claimed is:

1. Circuit arrangement for monitoring a regulated output voltage in an automotive vehicle, comprising:

an integrated circuit including a first voltage reference, a first voltage regulator coupled to said first voltage reference, a first comparator, coupled to both the first voltage reference and the first voltage regulator, for determining if a first threshold has been exceeded, and sending a reset signal, a second voltage reference spatially, mechanically, and electrically independent from said first voltage reference, a second comparator, coupled to both the second voltage reference and the first voltage regulator, for determining if a second threshold has been exceeded, and sending an output signal indicating that the second threshold has been exceeded.

2. Circuit arrangement as claimed in claim 1, wherein said integrated circuit further includes:

an oscillator circuit, and a watch dog timer, wherein the frequency of oscillation of said oscillation circuit is determined, at least in part, by said second voltage reference.

3. Circuit arrangement as claimed in claim 2, further including means, coupled to output signal of said second comparator, for disabling a main driver stage.

4. Circuit arrangement as claimed in claim 3, further including a driver stage coupled to said output signal of said second comparator for switching on alarm lamps.

5. Circuit arrangement as claimed in claim 2, further including a microprocessor coupled to said reset signal.

* * * * *